(12) United States Patent
Bi et al.

(10) Patent No.: US 10,937,703 B2
(45) Date of Patent: Mar. 2, 2021

(54) FIELD-EFFECT TRANSISTOR HAVING DUAL CHANNELS

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 40 days.

(21) Appl. No.: 16/381,129

(22) Filed: Apr. 11, 2019

(65) Prior Publication Data

US 2020/0328211 A1 Oct. 15, 2020

(51) Int. Cl.
*H01L 21/8238* (2006.01)
*H01L 27/092* (2006.01)
*H01L 29/161* (2006.01)
*H01L 29/10* (2006.01)

(52) U.S. Cl.
CPC ........... *H01L 21/823821* (2013.01); *H01L 21/823807* (2013.01); *H01L 27/0924* (2013.01); *H01L 29/1095* (2013.01); *H01L 29/161* (2013.01)

(58) Field of Classification Search
CPC ............ H01L 29/1095; H01L 27/0924; H01L 21/823807; H01L 29/161; H01L 21/823821
See application file for complete search history.

(56) References Cited

U.S. PATENT DOCUMENTS

| 5,411,905 | A | 5/1995 | Acovic et al. |
| 8,263,462 | B2 | 9/2012 | Hung et al. |
| 8,497,171 | B1* | 7/2013 | Wu ................ H01L 21/823821 438/218 |
| 9,093,533 | B2* | 7/2015 | Cheng ................ H01L 21/2053 |
| 9,293,373 | B1 | 3/2016 | Cheng et al. |
| 9,362,179 | B1* | 6/2016 | Cheng ............ H01L 21/823821 |
| 9,524,969 | B1* | 12/2016 | Balakrishnan .............. H01L 21/823821 |
| 9,559,018 | B2 | 1/2017 | Cai et al. |
| 9,590,106 | B1 | 3/2017 | Deng et al. |
| 9,786,666 | B2 | 10/2017 | Cheng et al. |

(Continued)

OTHER PUBLICATIONS

Bae, Dong-il, et al. "A novel tensile Si (n) and compressive SiGe (p) dual-channel CMOS FinFET co-integration scheme for 5nm logic applications and beyond." IEEE International Electron Devices Meeting (IEDM). IEEE, 2016; 4 pages.

*Primary Examiner* — Savitri Mulpuri
(74) *Attorney, Agent, or Firm* — Cantor Colburn LLP; Robert Sullivan

(57) ABSTRACT

An integrated semiconductor device having a substrate with a first substrate region and a second substrate region. The integrated semiconductor device further includes a first field-effect transistor disposed on the substrate in the first substrate region. The first field-effect transistor has a plurality of first fins having a first semiconductor material. In addition, the integrated semiconductor device includes a second field-effect transistor disposed on the substrate in the second substrate region. The second field-effect transistor has a plurality of second fins having a second semiconductor material that differs from the first semiconductor material.

10 Claims, 20 Drawing Sheets

(56) References Cited

U.S. PATENT DOCUMENTS

| | | | |
|---|---|---|---|
| 9,837,415 B2* | 12/2017 | Balakrishnan | ............................... H01L 21/823821 |
| 9,892,978 B2* | 2/2018 | Cheng | ............. H01L 21/823807 |
| 9,917,015 B2 | 3/2018 | Cheng et al. | |
| 10,147,651 B1* | 12/2018 | Bi | ..................... H01L 29/66537 |
| 2014/0097518 A1* | 4/2014 | Cheng | ............... H01L 29/66795 257/618 |
| 2014/0361377 A1* | 12/2014 | Jacob | ................ H01L 29/66795 257/369 |
| 2015/0028454 A1* | 1/2015 | Cheng | ................ H01L 27/0924 257/616 |
| 2016/0254196 A1* | 9/2016 | Cheng | ................ H01L 29/7843 438/478 |
| 2018/0240714 A1 | 8/2018 | Bi et al. | |

* cited by examiner

FIELD-EFFECT TRANSISTOR HAVING DUAL CHANNELS

BACKGROUND

The present invention generally relates to fabrication methods and resulting structures for semiconductor devices. More specifically, the present invention relates to an integrated semiconductor device with dual channel fin field-effect transistors.

Semiconductor structures or devices can be embodied as field-effect transistors, for example, fin field-effect transistors (finFETs). The finFET is a type of metal oxide semiconductor field effect transistor (MOSFET). More specifically, the finFET is a double-gate or multiple-gate MOSFET device that mitigates the effects of short channels and reduces drain-induced barrier lowering. The "fin" of a finFET refers to the narrow channel between source and drain regions. A thin dielectric layer on either side of the fin separates the fin channel from the gate.

P-type and n-type finFETs (p-finFET and n-finFET, respectively) have performance characteristics that depend on a material of the channels. Choosing the appropriate channel material for the different transistor types (e.g. p-finFET and n-finFET) is important in optimizing devices' performance. For example, silicon (Si) fins can be used with n-finFET devices, while silicon germanium (SiGe) alloy fins can be used with p-finFET devices.

SUMMARY

According to a non-limiting embodiment of the present invention, an integrated semiconductor device is provided that includes a first substrate region and a second substrate region. A first field-effect transistor disposed on the substrate in the first substrate region. The first field-effect transistor has a plurality of first fins having a first semiconductor material. In addition, the integrated semiconductor device includes a second field-effect transistor disposed on the substrate in the second substrate region. The second field-effect transistor has a plurality of second fins having a second semiconductor material that differs from the first semiconductor material.

Embodiments of the present invention are further directed to a method for fabricating an integrated semiconductor device. A non-limiting example of the method includes providing a substrate with a first substrate region and a second substrate region. The method further includes forming a first field-effect transistor disposed on the substrate in the first substrate region. The first field-effect transistor has a plurality of first fins having a first semiconductor material. In addition, the method includes forming a second field-effect transistor disposed on the substrate in the second substrate region. The second field-effect transistor has a plurality of second fins having a second semiconductor material that differs from the first semiconductor material.

According to yet another non-limiting embodiment, a method of fabricating an integrated semiconductor device includes providing a substrate with a first substrate region and a second substrate region. The method further includes forming a plurality of first fins extending from the substrate in the first substrate region. Each first fin of the plurality of first fins includes silicone (Si). In addition, the method provides for forming a plurality of second fins extending from the substrate in the second substrate region. Each second fin of the plurality of second fins includes a silicon germanium (SiGe) alloy and is wider than each first fin of the plurality of first fins.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings.

FIGS. 1-11 depict cross-sectional views of a semiconductor device after fabrication operations for forming an IC with dual channel fin field-effect transistors in accordance with aspects of the invention, in which:

FIG. 1 depicts a cross-sectional view illustrating a structure that results from performing initial fabrication operations in accordance with embodiments of this invention;

FIG. 2 depicts a cross-sectional view illustrating fabrication operations in accordance with embodiments of the invention;

FIG. 3 depicts a cross-sectional view illustrating fabrication operations in accordance with embodiments of the invention;

FIG. 4 depicts a cross-sectional view illustrating fabrication operations in accordance with embodiments of the invention;

FIG. 5 depicts a cross-sectional view illustrating fabrication operations in accordance with embodiments of the invention;

FIG. 6 depicts a cross-sectional view illustrating fabrication operations in accordance with embodiments of the invention;

FIG. 7 depicts a cross-sectional view illustrating fabrication operations in accordance with embodiments of the invention;

FIG. 8 depicts a cross-sectional view illustrating fabrication operations in accordance with embodiments of the invention;

FIG. 9. depicts a cross-sectional view illustrating fabrication operations in accordance with embodiments of the invention;

FIG. 10 depicts a cross-sectional view illustrating fabrication operations in accordance with embodiments of the invention; and FIG. 11 depicts a cross-sectional view illustrating fabrication operations in accordance with embodiments of the invention.

FIGS. 12-20 depict cross-sectional views of a semiconductor device after fabrication operations for forming an IC with dual channel fin field-effect transistors where channels have different widths, in which:

FIG. 12 depicts a cross-sectional view illustrating a structure that results from performing initial fabrication operations in accordance with embodiments of this invention;

FIG. 13 depicts a cross-sectional view illustrating fabrication operations in accordance with embodiments of the invention;

FIG. 14 depicts a cross-sectional view illustrating fabrication operations in accordance with embodiments of the invention;

FIG. 15 depicts a cross-sectional view illustrating fabrication operations in accordance with embodiments of the invention;

FIG. 16 depicts a cross-sectional view illustrating fabrication operations in accordance with embodiments of the invention;

FIG. 17 depicts a cross-sectional view illustrating fabrication operations in accordance with embodiments of the invention;

FIG. 18 depicts a cross-sectional view illustrating fabrication operations in accordance with embodiments of the invention;

FIG. 19 depicts a cross-sectional view illustrating fabrication operations in accordance with embodiments of the invention; and FIG. 20 depicts a cross-sectional view illustrating fabrication operations in accordance with embodiments of the invention.

Figure 1:
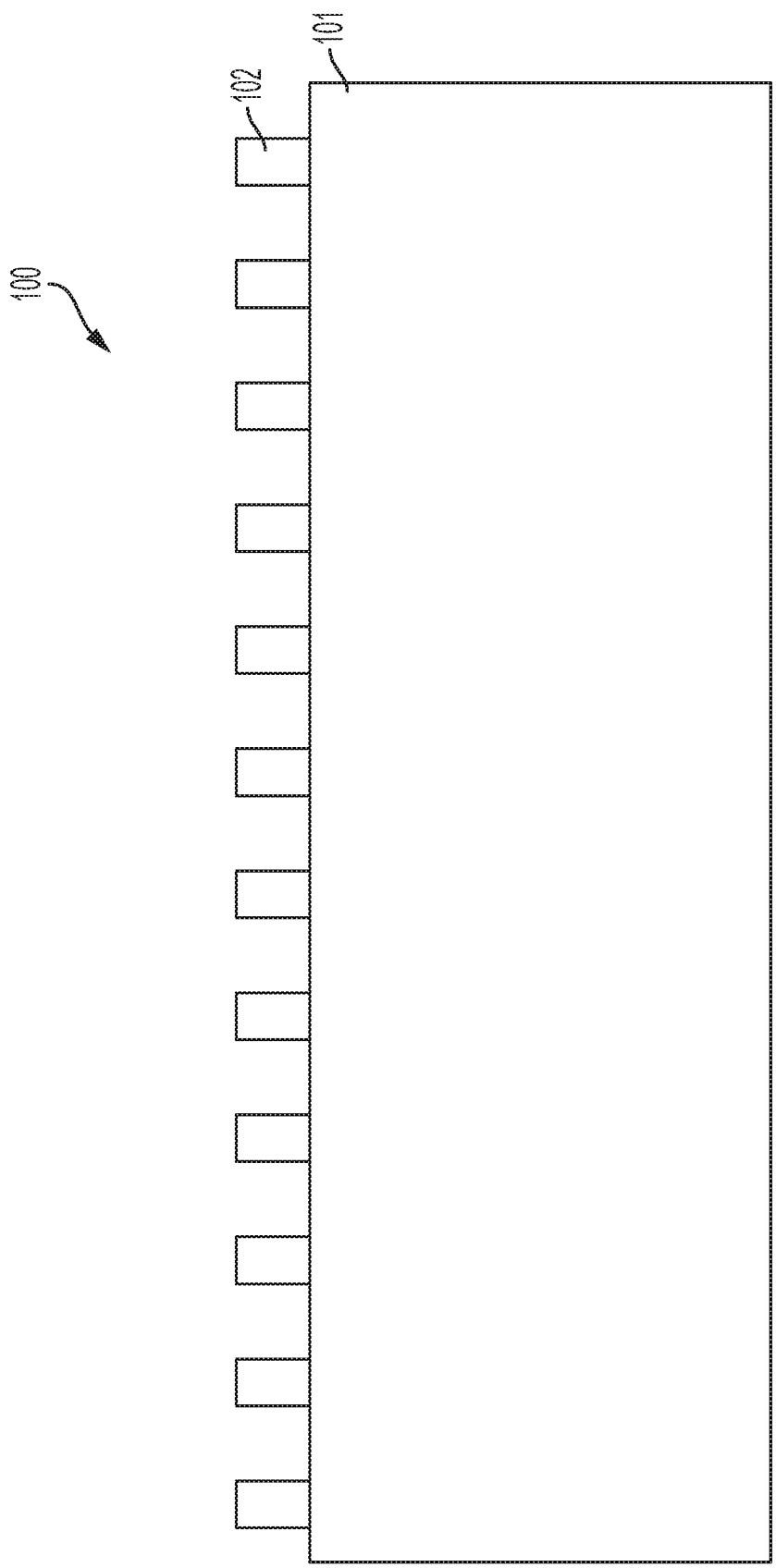

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, in present semiconductor technology, for example, complementary metal oxide semiconductor (CMOS) technology, devices such as p-type and n-type field-effect transistors are typically fabricated upon semiconductor substrates, such as silicone (Si) substrates or silicon on insulator (SOI) substrates. In other words, CMOS uses complementary and symmetrically-oriented pairs of p-type and n-type metal oxide semiconductor field effect transistors (MOSFETs) arranged on silicon. A MOSFET, which is used for amplifying or switching electronic signals for logic functions, has source and drain regions connected by a channel. The source region is a terminal through which current in the form of majority charge carriers electrons or holes enters the channel, and the drain region is a terminal through which current in the form of majority charge carriers leaves the channel. In a p-type MOSFET (p-FET), the majority charge carriers are holes that flow through the channel, and in an n-type MOSFET (n-FET), the majority charge carriers are electrons that flow through the channel. A gate overlies the channel and controls the flow of current between the source and drain regions. The channel can be defined by a thin "fin" that provides more than one surface through which the gate controls the flow of current, thereby making the p-FETs and n-FETs, p-finFET and n-finFET devices, respectively. Generally, the length of the fin is greater than the width.

CMOS logic technology, based on the conventional fin-FET structure described above, will unescapably approach performance limitations at the 5 nm technology node and beyond, due to the continuous physical scaling. The introduction of new channel materials, together with the necessary strain engineering, represents an important option to increase the transistor channel mobility and, in turn, ensure continuous CMOS logic scaling.

P-type and n-type finFETs (p-finFET and n-finFET, respectively) have performance characteristics that depend on a material of the channels. Choosing the appropriate channel material for p-finFET and n-finFET is important in optimizing devices' performance. SiGe is a p-finFET channel alternative to Si due to both its superior hole mobility and mature processing in view of mass production. Strain is traditionally acknowledged as a charge carrier mobility booster, having been already implemented in previous technology nodes in the form of embedded SiGe source and drain structures (S/D) (eSiGe) for Si p-finFETs. On the other hand, little solution has been known for effective electron carrier mobility booster, in the form of a tensile stressor for Si n-finFET.

Turning now to an overview of the aspects of the invention, one or more embodiments of the invention address the above-described shortcomings of the prior art by providing an integrated device with dual channel fin field-effect transistors, namely, a Si n-finFET channel and a SiGe p-finFET channel fabricated by epitaxial growth on a silicone substrate. Aspects of the invention enable the simultaneous implementation of tensile strain for Si n-channel, together with compressive strain for SiGe p-channel by replacing Si with SiGe, thereby enabling continuous performance improvements.

Turning now to a more detailed description of aspects of the present invention, FIGS. 1-11 depict cross-sectional views of a semiconductor device 100 after fabrication operations for forming an IC with dual channel fin field-effect transistors in accordance with aspects of the invention. Referring initially to FIG. 1, there is shown a cross-sectional view of the semiconductor structure 100 after known fabrication operations are used to form a plurality of fin hard masks 102 on top of a substrate 101. The plurality of fin hard masks 102 can be formed by depositing a blanket hard mask layer (not shown) over the upper surface of the substrate 102 by any conventional methods, such as, for example, chemical vapor deposition (CVD), plasma-enhanced chemical vapor deposition (PECVD), chemical solution deposition, atomic layer deposition, or physical vapor deposition. Alternatively, the hard mask layer can be formed utilizing a thermal oxidation, nitridation or oxynitridation process. Afterward, the portions of the blanket hard mask layer are recessed by known fabrication process, for example, directional etch (e.g., RIE), self-aligned double patterning (SADP) process, or self-aligned quadruple patterning (SAQP) process to form the plurality of fin hard masks 102. The hard mask material can be a dielectric material such as, for example, an oxide, nitride, oxynitride or a multilayered stack thereof. In embodiments of the invention, the hard mask material is silicone mononitride (SiN).

The substrate 101 can be formed of any semiconductor material including, for example, Si, Ge, SiGe, silicone carbide (SiC), silicone germanium carbide (SiGeC) or other like semiconductor materials. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. The substrate 101 can also have multiple layers, for example, a semiconductor-on-insulator (SOI) substrate, a germanium-on-insulator (GeOI) substrate or a silicone-germanium-on-insulator (SGOI) substrate.

Figure 2:
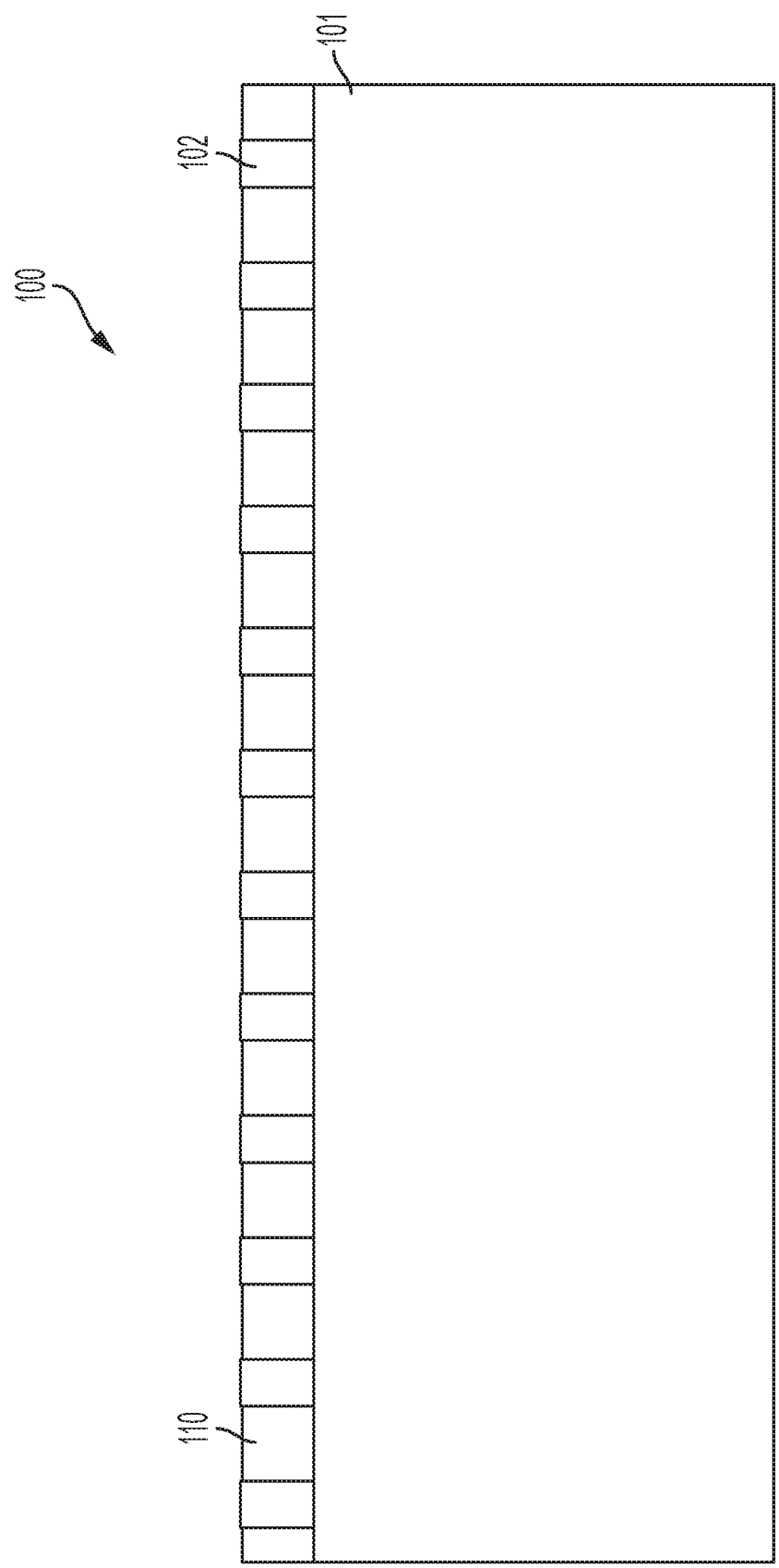

In FIG. 2, a dielectric material 110 is being deposited between the fin hard masks 102. After depositing the dielectric material 110, the material 110 is polished, by known process, such as, for example, a chemical mechanical polishing (CMP) process, to be substantially coplanar with upper portions of the hard masks 102. Non-limiting examples of suitable dielectric material 110 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

Figure 3:
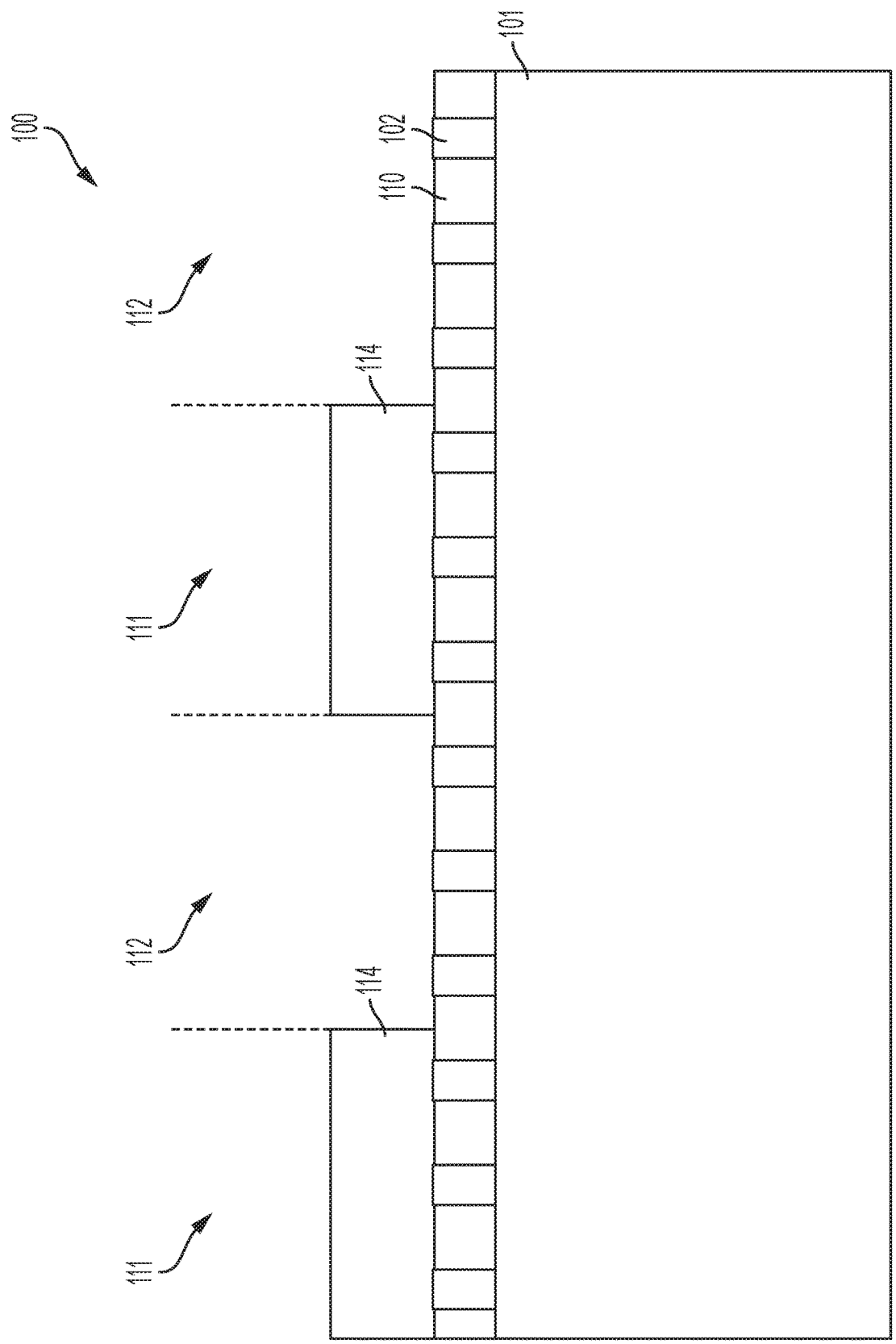
Figure 4:
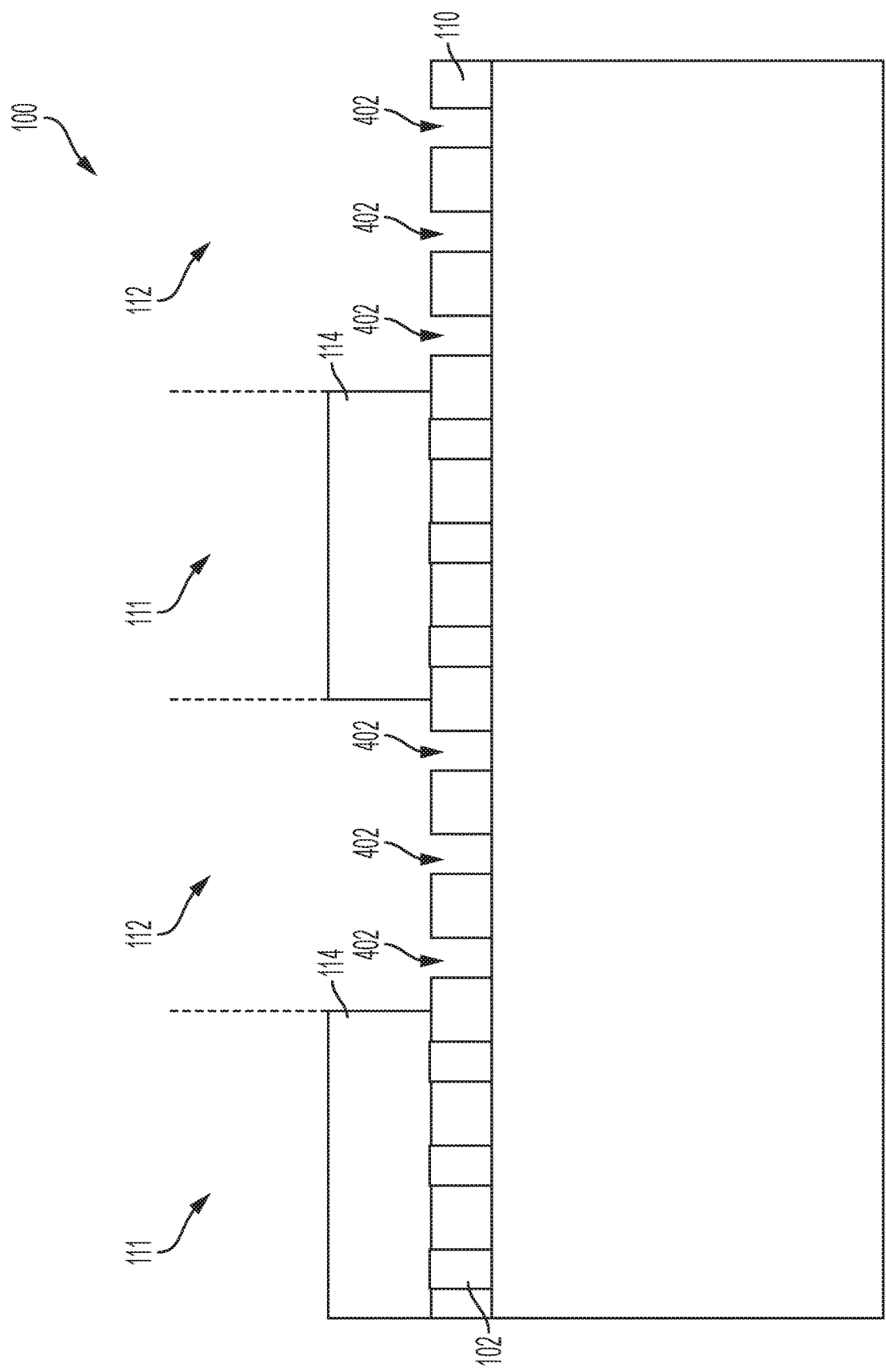

In FIG. 3, known fabrication operations have been used to form a channel mask layer 114 in the first substrate regions 111 to protect the first substrate regions 111 from a reactive ion etch (RIE) or a similar etching process that is used to remove the fin hard masks 102 in the second substrate regions 112 (shown in FIG. 4).

Accordingly, as shown in FIG. 3, the substrate 102 includes the first substrate regions 111 that can be doped by any known process, for example, by ion implementation, plasma doping or plasma immersion, with a first dopant, such as an n-type dopant (e.g., phosphorus, arsenic, or antimony), and the second substrate regions 112 that can be doped by any known process, for example, by ion implementation, plasma doping or plasma immersion, with a second dopant, such as an p-type dopant (e.g., boron, gallium or indium). At least a first one of the first substrate regions 111 can be used as a basis to form an n-type field-effect transistor, and more specifically, an n-type fin field-effect transistor (n-finFET). Similarly, at least a first one of the second substrate regions 112 can be used as a basis to form a p-type field-effect transistor, and more specifically, a p-type fin field-effect transistor (p-finFET).

While FIG. 3 illustrates that the first substrate regions 111 and the second substrate regions 112 are interleaved with one another, it is to be understood that this is not required by the present invention, and that other configurations are possible. The following description relates to the exemplary embodiments for reasons of clarity and brevity.

In FIG. 4, known semiconductor fabrication operations (e.g., RIE) have been used to remove the fin hard masks 102 not protected by the channel mask layer 114. In other words, the fin hard masks 102 are removed in the second substrate regions 112. Such removal results in empty regions 402 that are surrounded by the dielectric material 110.

Figure 5:
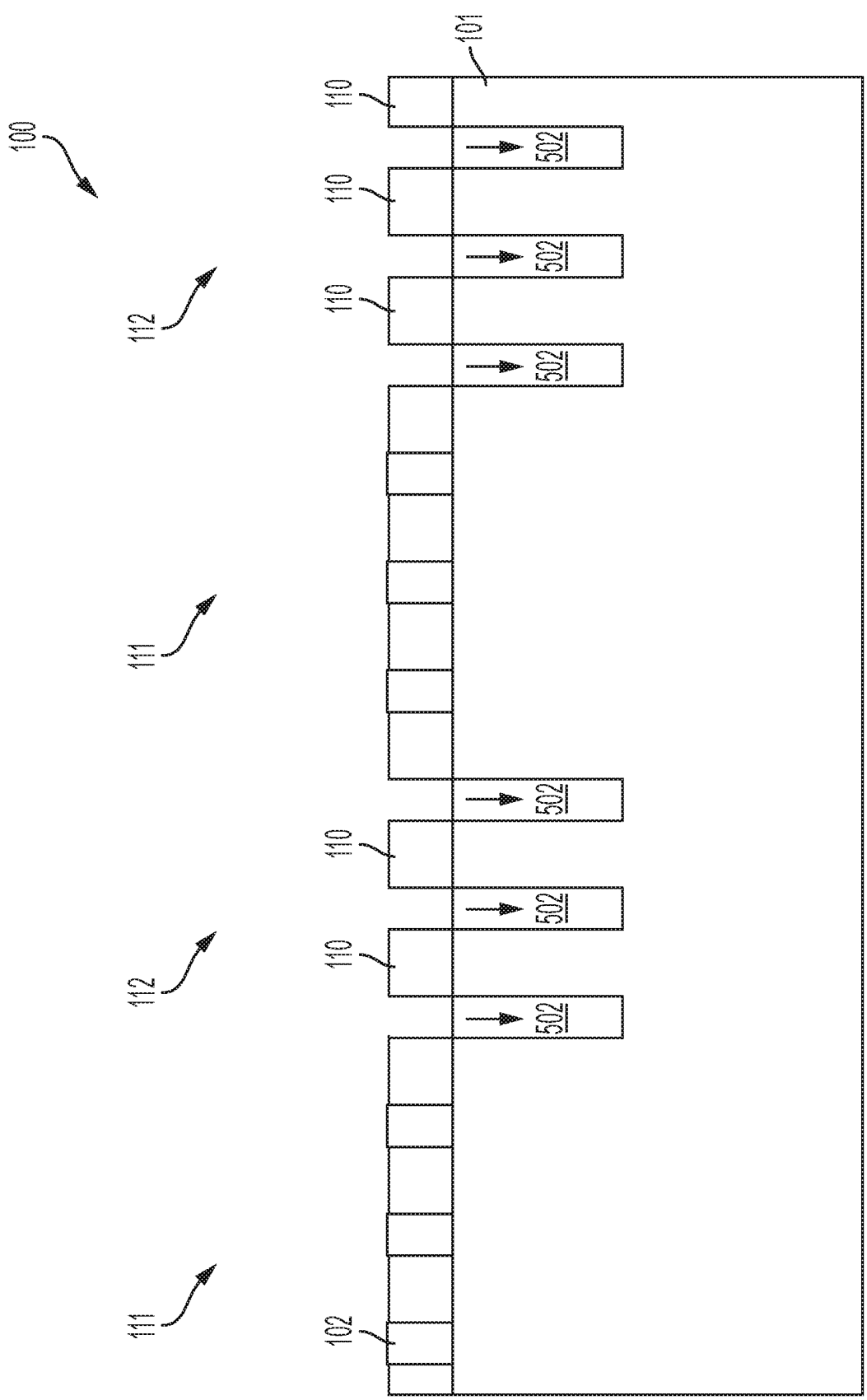

In FIG. 5 know semiconductor fabrication operations have been used to remove the channel mask layer 114 in the first substrate regions 111. In addition, empty regions 402 in the second substrate region 112 have been recessed to form trench regions 502. Accordingly, as illustrated in FIG. 5, the trench regions 502 are formed within the substrate 101 between the dielectric material 110, and terminate within the substrate 101. Each material can be removed by dry etch and/or wet etch. In some embodiments, the channel mask layer 114 includes SiN and the substrate 101 includes Si dry etch processes, such as RIE can be used to remove the channel mask layer 114 and form the trench regions 502. Alternatively, wet etching can be used. For example, hot phosphoric acid can be used to remove the channel mask layer 114 and aqueous solution containing ammonia can be used to etch Si.

Figure 6:
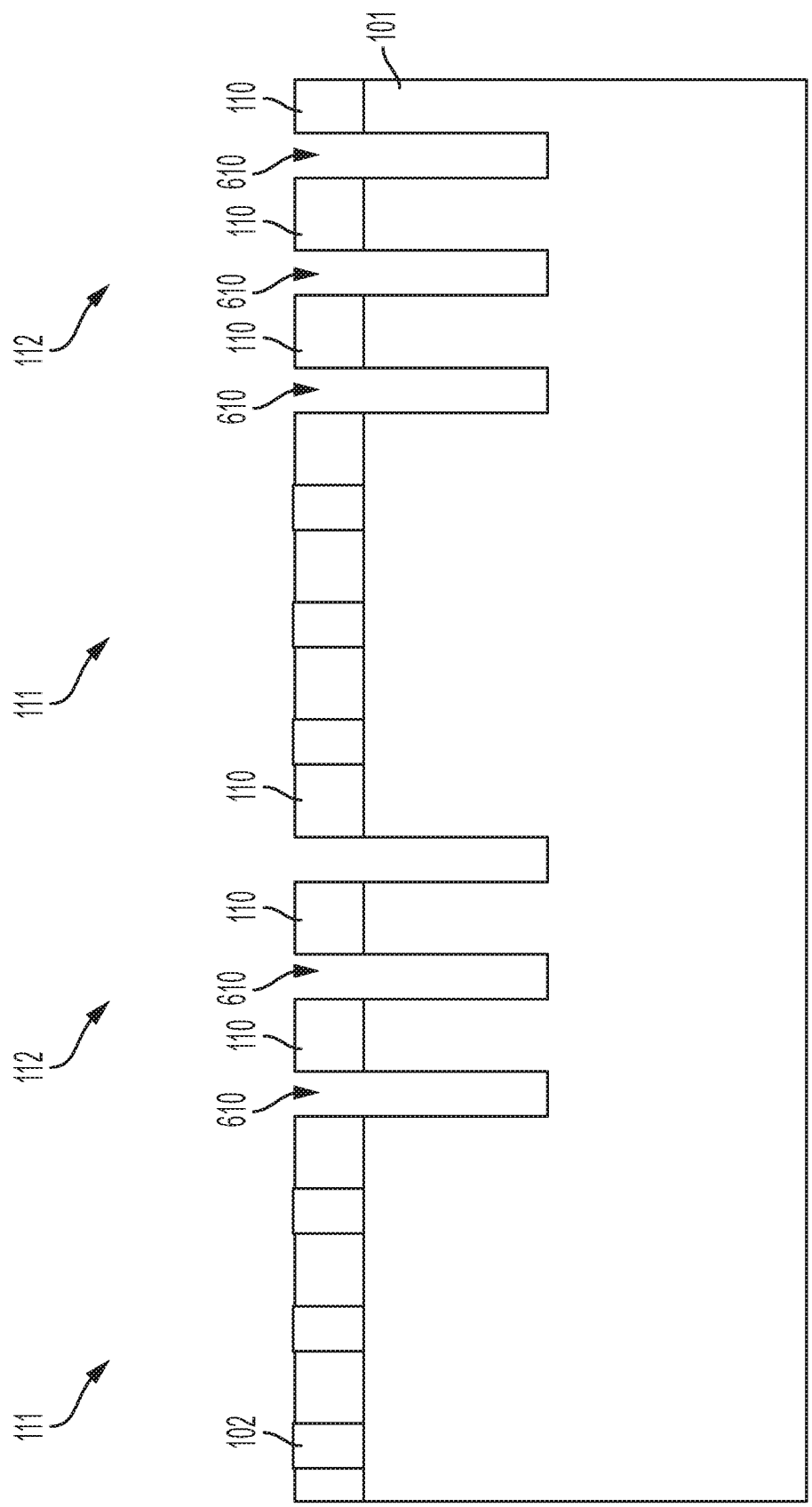

In FIG. 6, known semiconductor operations have been used to form a silicon germanium alloy (SiGe) layers 610 in the trench regions 502 in the second substrate regions 112. The SiGe layers 610 can have an initial germanium content of from 10 atomic % to 60 atomic % germanium. Other initial germanium contents that are lesser than, or greater than, the aforementioned range can be also used in the present invention. The SiGe layers 610 can be formed by an epitaxial growth (or epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In embodiments of the present invention, the SiGe layers 610 have an epitaxial relationship (i.e., same crystal orientation) as that of the silicone material of the substrate 101. Examples of various epitaxial growth processes that are suitable for use in forming SiGe layers 610 include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition can result in crystal defects and film cracking.

Figure 7:
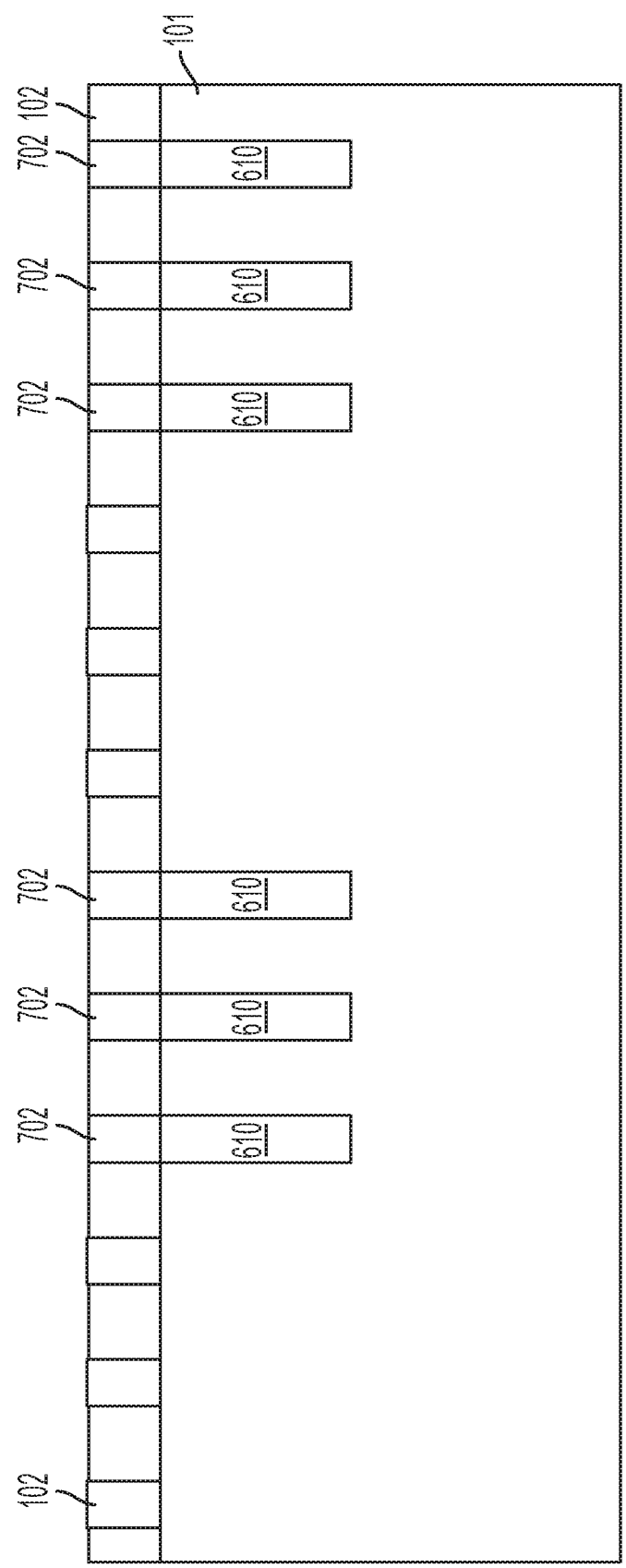

In FIG. 7, fin hard masks 702 are formed above the SiGe layers 610 in the second substrate regions 112 by deposition, such as, for example, CVD, PECVD, chemical solution deposition, atomic layer deposition, or physical vapor deposition. The fin hard masks 702 can be formed from, for example, SiN. The fin hard masks 702 are substantially coplanar with the upper surfaces of the top of the dielectric material 110 following a CMP process.

Figure 8:
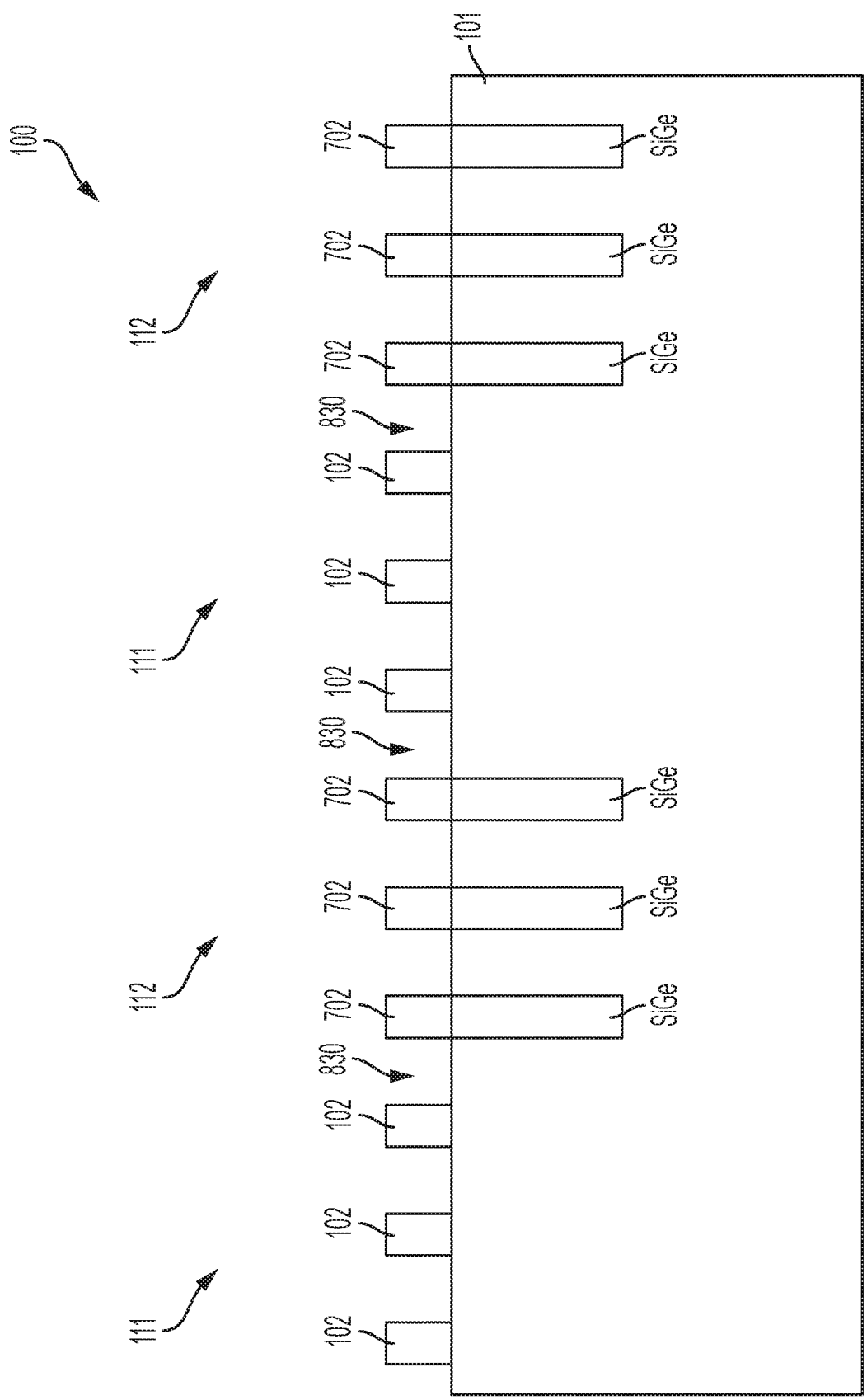

In FIG. 8, the dielectric material 110, previously formed between the fin hard masks 102 and the fin hard masks 702, is removed in the first substrate region 111 and the second substrate region 112, respectively, to form empty regions 830 by known semiconductor fabrication process, for example, dry etching, wet etching, or a combination of dry etching and wet etching. Accordingly, the top surface of the substrate 101 is exposed in the portions previously covered by the dielectric material 110.

Figure 9:
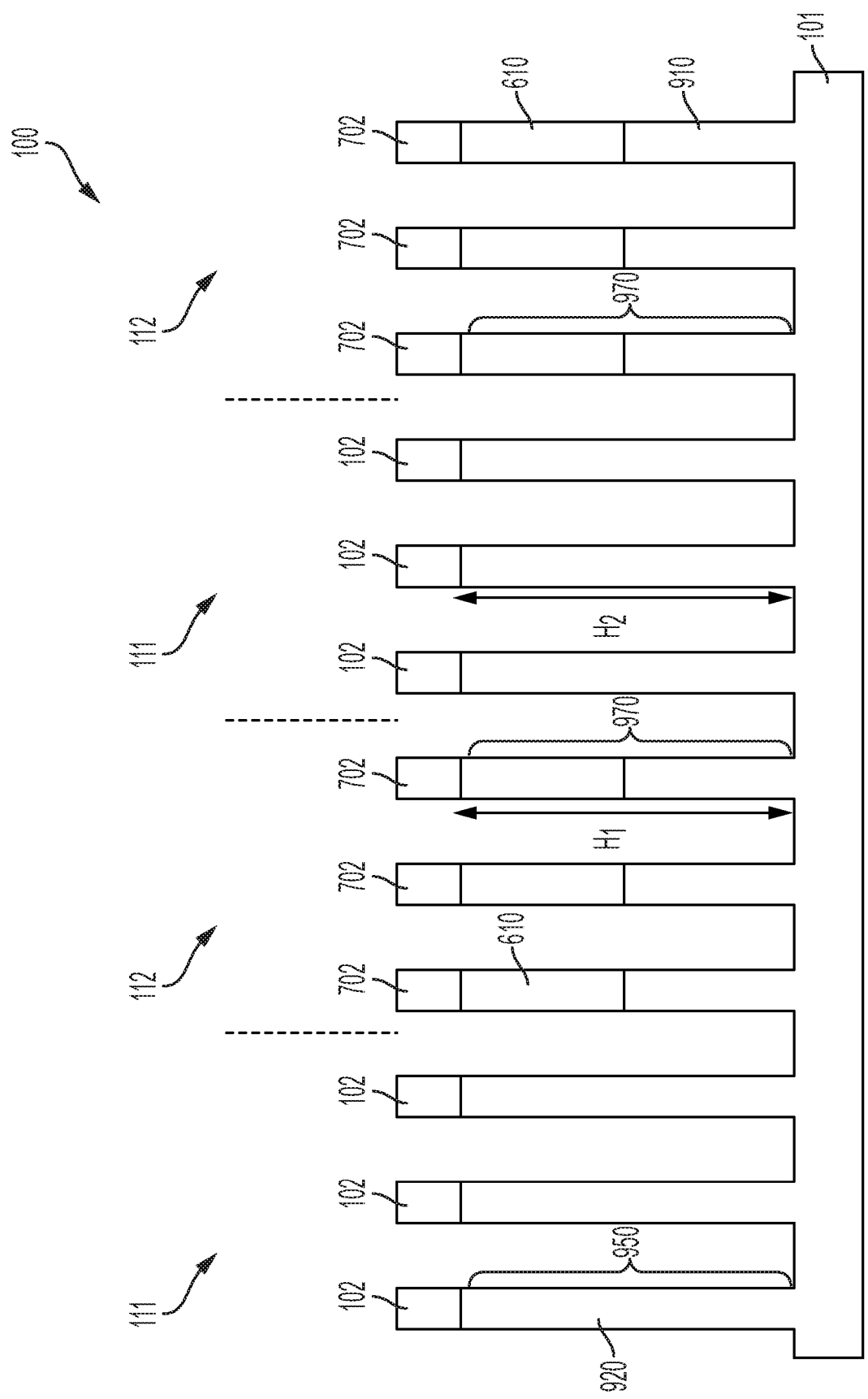

In FIG. 9, a plurality of first fins 950 and a plurality of second fins 970 are formed in the first substrate regions 111 and in the second substrate regions 112, respectively. In order to form the plurality of first fins 950 and the plurality of second fins 970, the substrate 101 in the empty regions 830 is recessed to a first height "H1" in the first substrate regions 111 and a second height "H2" in the second substrate regions 112 by a known semiconductor fabrication operation, for example, RIE. In other words, the RIE process etches a single material (i.e., Si) as SiGe is protected by the fin hard masks 102,702. Etching a single material results in uniform fin height of the plurality of first fins 950 and the plurality of second fins 970. Accordingly, the first height "H1" and the second height "H2" are equal.

After fabrication operations illustrated in FIG. 9, each first fin 950 has a first Si layer 920, while each second fin 970 has the SiGe layers 610 above a second Si layer 910. As a result, the first fins 950 are formed in the first substrate regions 111 and the second fins 970 are formed in the second substrate regions 112. In embodiments of the present invention, the n-finFET having the plurality of the first fins 950 is formed in the first substrate regions 111, and the p-finFET having the plurality of the second fins 970 is formed in the second substrate regions 112.

Figure 10:
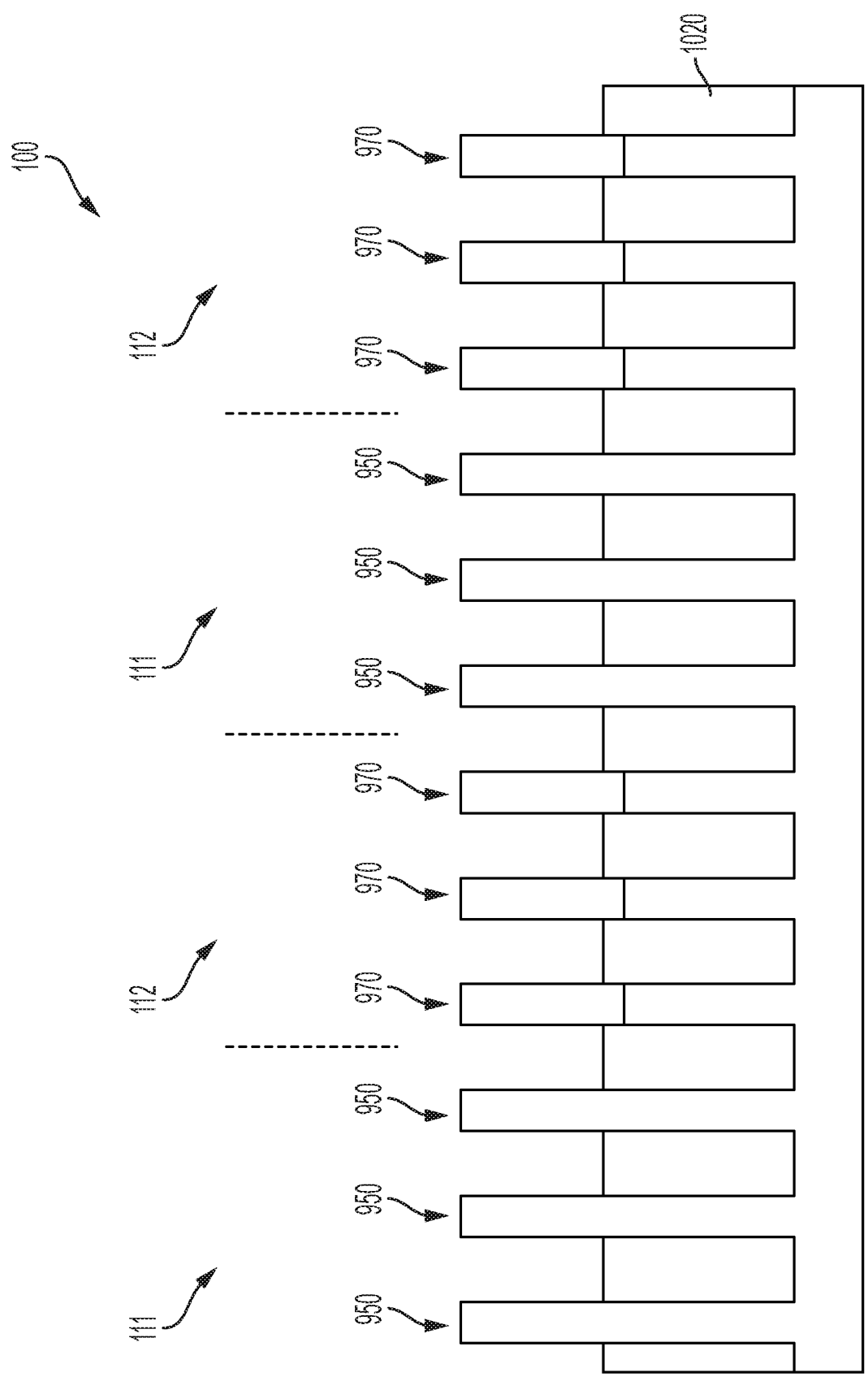

In FIG. 10, known semiconductor operations have been used to deposit a dielectric material 1020 on and between the fins 950, 970 and fin hard masks 102, 702. After depositing the dielectric material 1020, the surface can be polished to expose the fin hard mask 102, 702 on top of the fins 950, 970. The dielectric material 1020 forms shallow trench isolation (STI) regions between the fins 950, 970. Non-limiting examples of suitable dielectric materials 1020 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

Subsequently, known semiconductor operations can be used to recess the dielectric material 1020 and remove the fin hard masks 102, 702 (shown in FIG. 10). One or more etching processes can be performed to recess the dielectric material 1020 and remove the fin hard masks 102, 702. Each material can be removed by dry etch and/or wet etch. Dry etch processes, such as reactive ion etch (RIE) can be used. Alternatively, wet etching can be used. For example, hot phosphoric acid, an aqueous solution containing hydrogen peroxide, and/or an aqueous solution containing ammonia can be used. The dielectric material 1020 is recessed by known etch processes, for example, dry etching, wet etching, or a combination of dry etching and wet etching. Wet etching of the STI oxides can be performed using hydrofluoric acid that is selective to Si and SiGe ("selective" means the process etches oxide at a much faster rate (e.g., >10 times) than the Si or SiGe).

Figure 11:
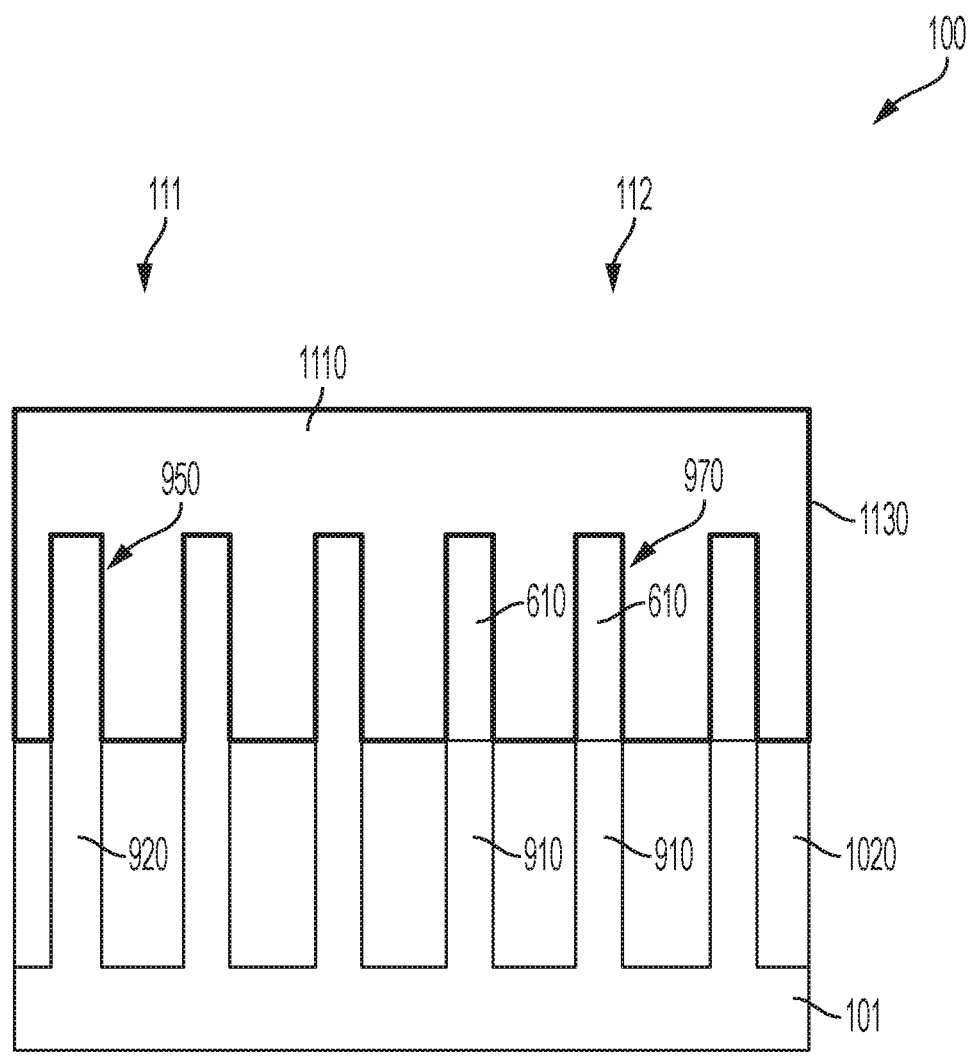

FIG. 11 is a cross-sectional side view after forming a gate 1110 on the first fins 950 of the first substrate regions 111 and the second fins 970 of the second substrate regions 112. The gate 1110 can include a metal gate stack with a gate dielectric layer 1130 deposited directly on the first fins 950 and second fins 970. The gate dielectric layer 1130 can be a dielectric material having a dielectric constant greater than about 3.9, about 7.0, or about 10.0. Non-limiting examples of suitable materials for the dielectric layer 1130 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric material layer 1130 can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The gate 1110 can include a work function metal deposited on the gate dielectric layer 1130, followed by a conductive gate material (not shown). The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

A conductive material is deposited over the dielectric material(s) and work function layer(s) to form the gate stacks. Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The conductive metal can be deposited by a suitable deposition process, for example, CVD, PECVD, PVD, plating, thermal or e-beam evaporation, and sputtering. While FIG. 11 shows that both transistors (for example, n-finFET and p-finFET) share the same gate, the transistors can have different gate materials. Furthermore, n-finFET and p-finFET gates can be electrically connected or disconnected, depending on the applications. In some embodiments, a single conductive material is used to achieve the workfunction and conductive functions.

After forming the gate 1110 (shown in FIG. 11) source/drain regions (not shown) can be formed utilizing an epitaxial growth process from exposed portions of each fin 950, 970. The source/drain regions can have any semiconductor material including, for example, Si, Ge or SiGe alloys. The semiconductor material that provides the source/drain regions is doped with an n-type dopant or a p-type dopant as are well known those skilled in the art. The doping can be achieved during the epitaxial growth of the semiconductor material that provides the source/drain regions or after epitaxial growth of an intrinsic semiconductor material by utilizing ion implantation or gas phase doping.

Referring now to FIGS. 12-20, which show an alternative embodiment of the present invention, where fins that have a SiGe layer are wider than fins with a Si layer. The wider SiGe fins alleviate the phenomena associated with a fin loss, during, for example, a transistor fabrication, where a portion of fin sidewalls is consumed, resulting in the final fin width that is less than that of the starting fin. This phenomenon is sometimes referred as fin loss. The fin loss is typically greater for SiGe fins than for Si fins. Accordingly, having a wider starting SiGe fins compensates for the extra SiGe fin loss results in a final device (not shown) having both Si fin and SiGe fin with substantially same thickness.

Figure 12:
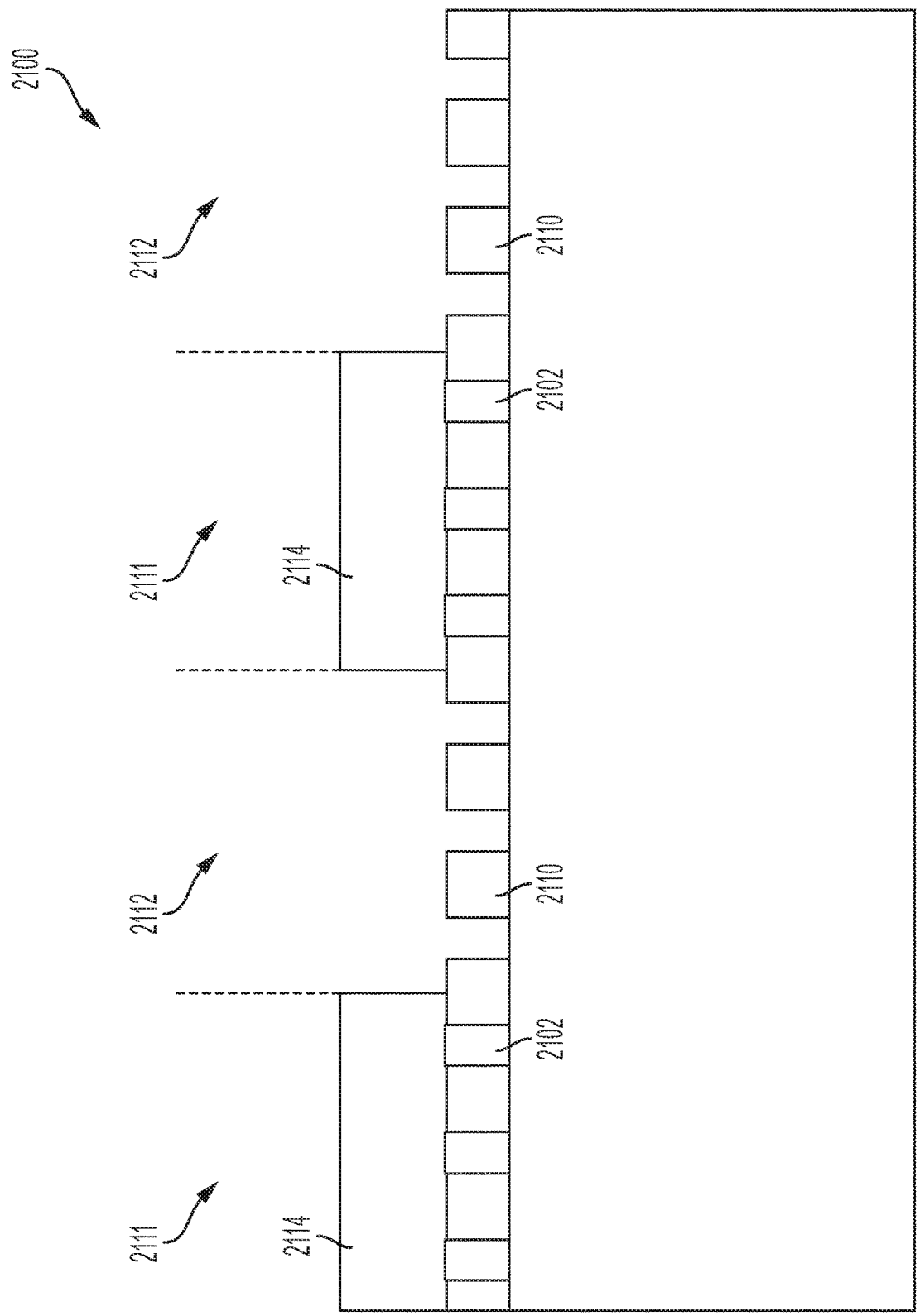

FIG. 12 depicts a cross-sectional view of a structure 2100 that results from performing initial fabrication operations according to embodiments of the invention. More specifically, after performing initial fabrication operations described in FIGS. 1-3, the resulting semiconductor structure 2100 has a plurality of fin hard masks 1202 positioned in first substrate regions 2111 on top of a substrate 2101. The hard mask material can be a dielectric material such as, for example, an oxide, nitride, oxynitride or a multilayered stack thereof. In embodiments of the invention, the hard mask material is silicone mononitride (SiN). The substrate 101 can be formed of any semiconductor material including, for example, Si, Ge, SiGe, silicone carbide (SiC), silicone germanium carbide (SiGeC) or other like semiconductor materials. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. The substrate 101 can also have multiple layers, for example, a semiconductor-on-insulator (SOI) substrate, a germanium-on-insulator (GeOI) substrate or a silicone-germanium-on-insulator (SGOI) substrate.

As further illustrated in FIG. 12, a dielectric material 2110 formed between the fin hard masks 2102 by, for example, deposition, and is polished by known process, such as, for example, a chemical mechanical polishing (CMP) process, to be substantially coplanar with upper portions of the hard masks 2102. Non-limiting examples of suitable dielectric material 2110 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof. A channel mask layer 2114 is formed in in first substrate regions 2111 to protect the first substrate region 2111 from a reactive ion etch (RIE) or a similar etching process that was used to remove a plurality of fin hard masks (not shown) as described in FIGS. 1 to 3 in second substrate regions 2112.

According to embodiment of the present invention, the substrate 2101 includes the first substrate regions 2111 that can be doped by any known process, for example, by ion implementation, plasma doping or plasma immersion, with a first dopant, such as an n-type dopant (e.g., phosphorus, arsenic, or antimony), and the second substrate regions 2112 that can be doped by any known process, for example, by ion implementation, plasma doping or plasma immersion, with a second dopant, such as an p-type dopant (e.g., boron, gallium or indium). At least a first one of the first substrate regions 2111 can be used as a basis to form an n-type field-effect transistor, and more specifically, an n-type fin field-effect transistor (n-finFET). Similarly, at least a first one of the second substrate regions 2112 can be used as a basis to form a p-type field-effect transistor, and more specifically, a p-type fin field-effect transistor (p-finFET).

Figure 13:
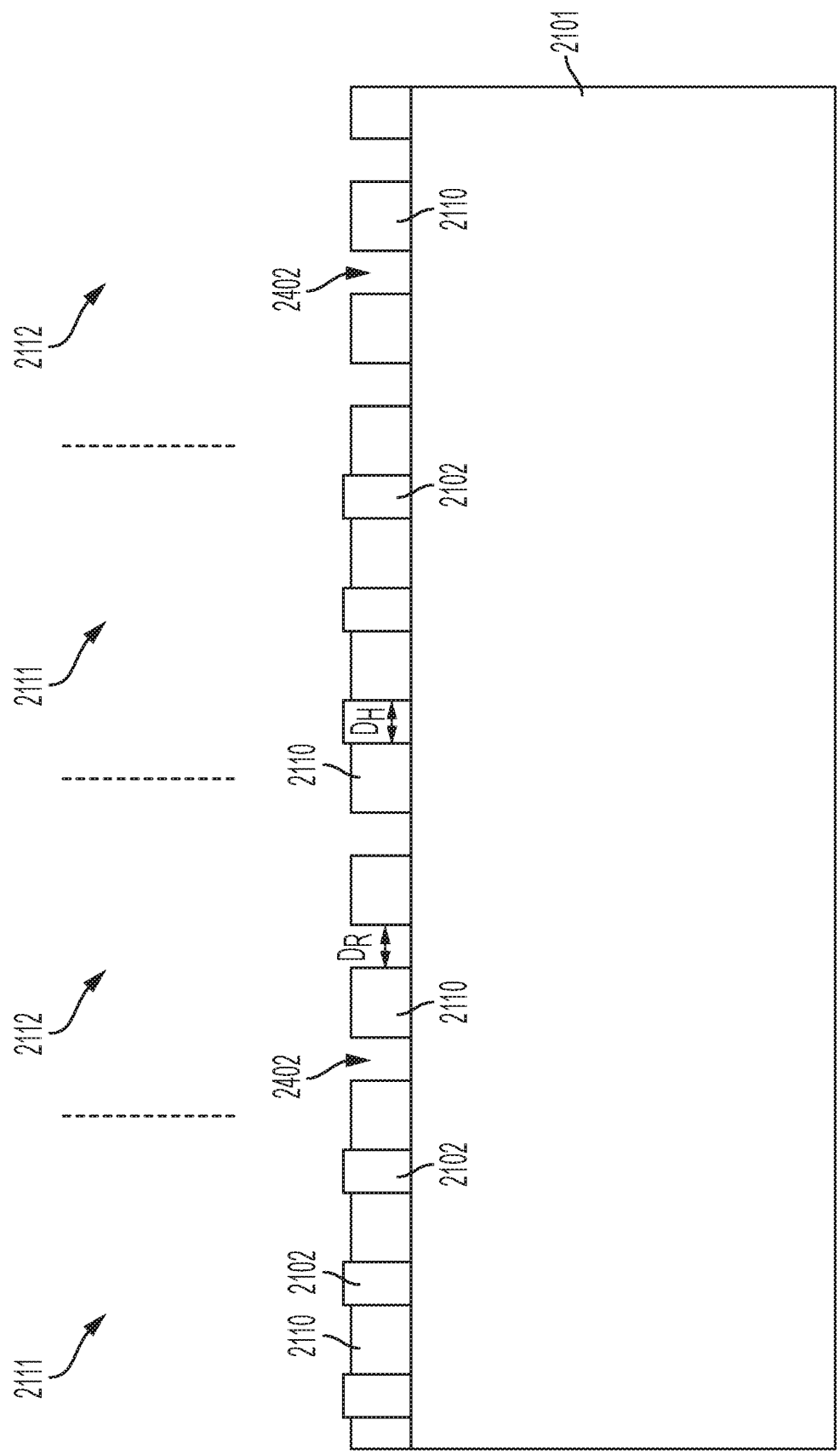

In FIG. 13, known semiconductor fabrication operations have been used to remove the channel mask layer 2114 in the first substrate regions 2111, and to widen empty regions 2402 in the second substrate region 2112 to a width "Dr" that is wider than the width "Dh" of the fin hard masks 2102. The empty regions 2402 can be widened by, for example, an isotropic oxide etch. The empty regions 2402 can be widened by, for example, 2 nm.

Figure 14:
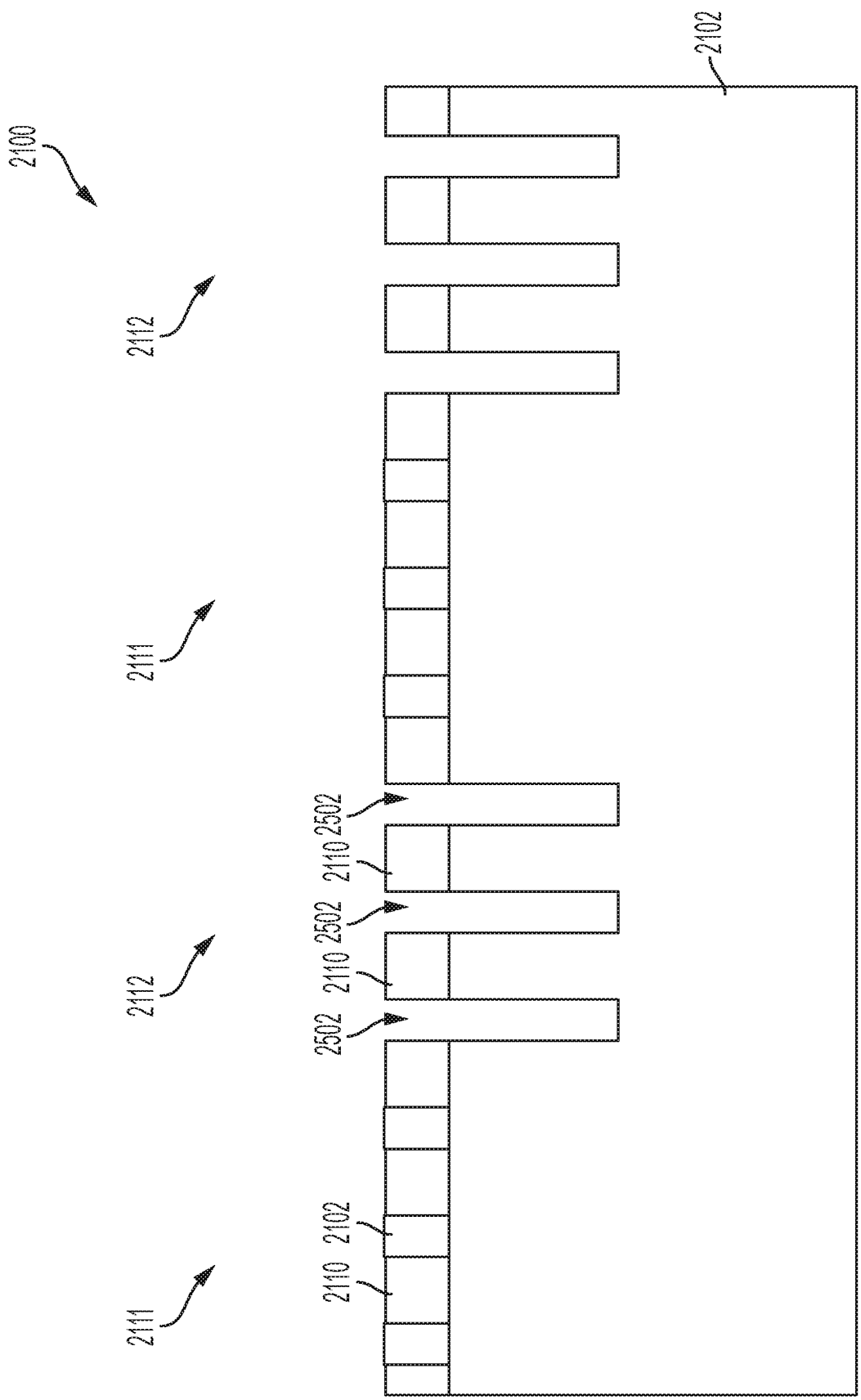

In FIG. 14, known semiconductor fabrication operations have been used to recess empty regions 2402 (shown in FIG. 13) in the second substrate region 2112 to form trench regions 2502. Accordingly, as illustrated in FIG. 14, the trench regions 2502 are formed between the dielectric material 2110 and terminate within the substrate 2101.

Figure 15:
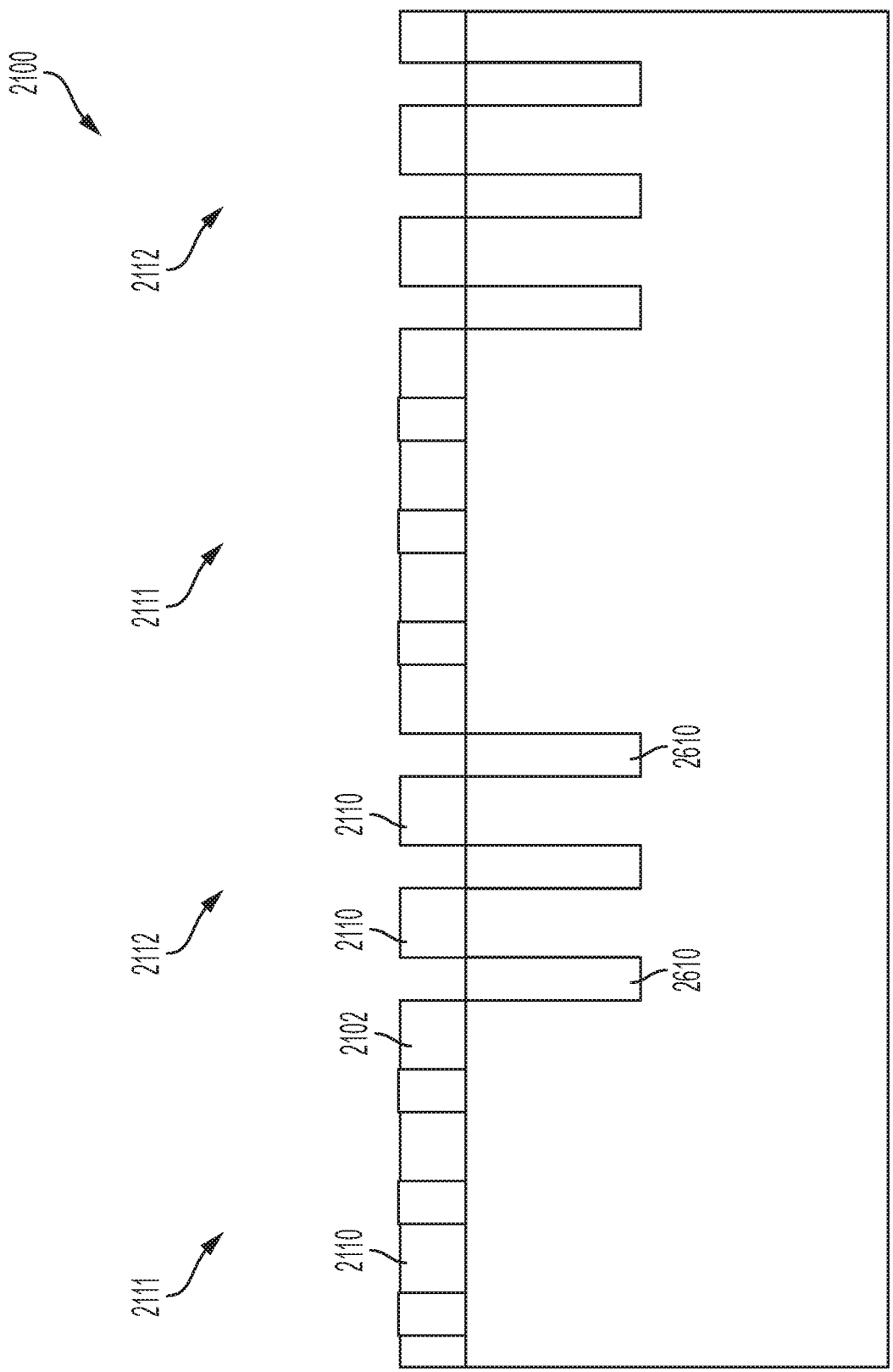

In FIG. 15, known semiconductor operations have been used to form a silicon germanium alloy (SiGe) layers 2610 in the trench regions 2502 (shown in FIG. 14) in the second substrate regions 2112. The SiGe layers 2610 can have an initial germanium content of from 10 atomic % to 60 atomic % germanium. Other initial germanium contents that are lesser than, or greater than, the aforementioned range can be also used in the present invention. SiGe layers 2610 can be formed by an epitaxial growth (or epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In embodiments of the present invention, SiGe layers 2610 have an epitaxial relationship (i.e., same crystal orientation) as that of the silicone material of the substrate 2101. Examples of various epitaxial growth processes that are suitable for use in forming SiGe layers 610 include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition can result in crystal defects and film cracking.

Figure 16:
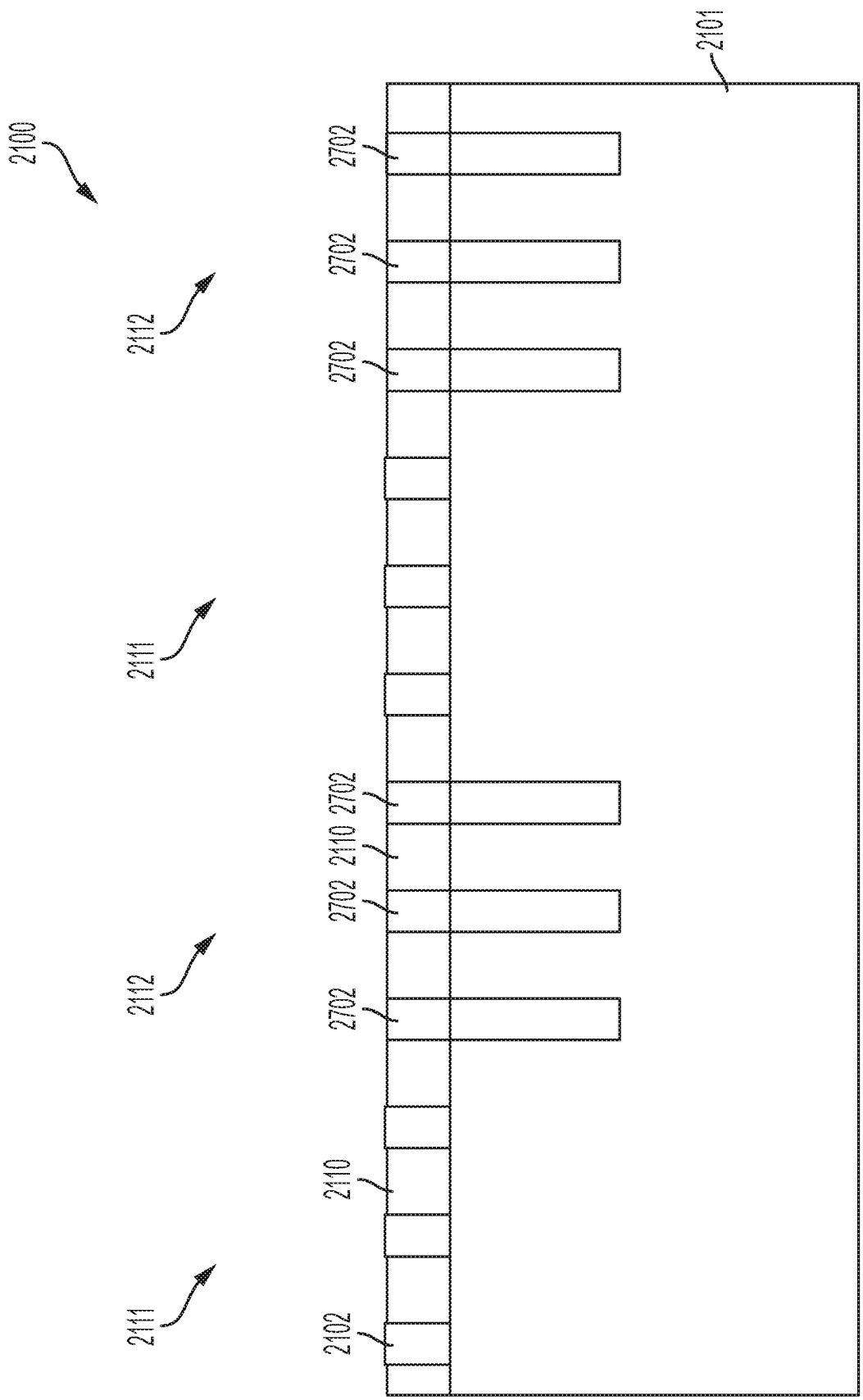

In FIG. 16, fin hard masks 2702 are formed above the SiGe layers 2610 in the second substrate regions 2112 by deposition, such as, for example, CVD, PECVD, chemical solution deposition, atomic layer deposition, or physical vapor deposition. As the empty regions 2402, and consequently, the trench region 2502, are wider than the width of the fin hard mask 2102, the fin hard masks 2702 are wider than the fin hard masks 2102. The fin hard masks 2702 can be formed from, for example, SiN. The fin hard masks 2702 are substantially coplanar with the upper surfaces of the top of the dielectric material 2110 following a CMP process.

Figure 17:
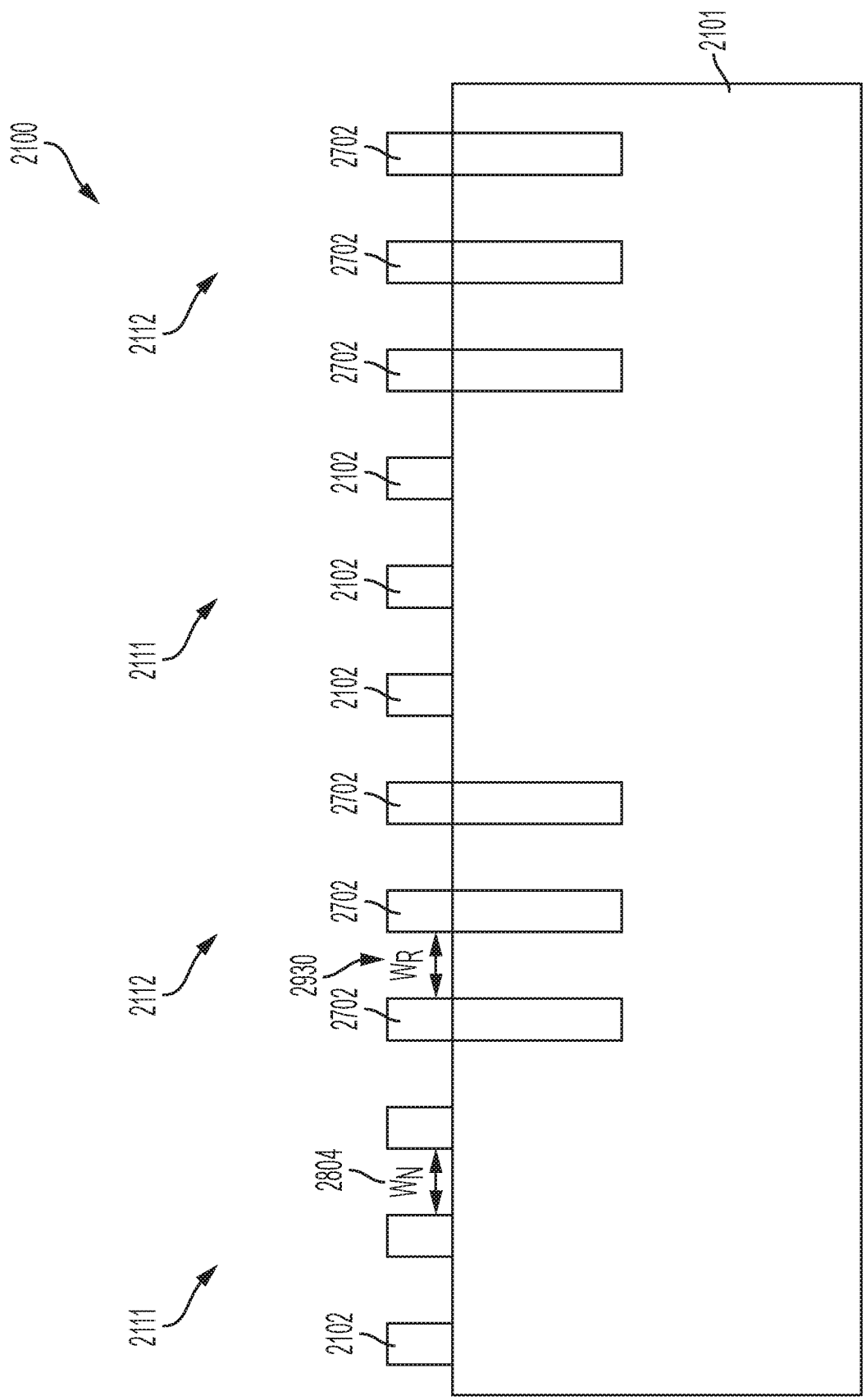

In FIG. 17, the dielectric material 2110 between the fin hard masks 2102 and fin hard masks 2702 is removed in the first substrate regions 2111 and the second substrate regions 2112, respectively, to form empty regions 2830 in the first substrate region and regions 2930 in the second substrate regions 2112 by known semiconductor fabrication process, for example, dry etching, wet etching, or a combination of dry etching and wet etching. Accordingly, because the empty region 2830 is formed in the widened empty regions 2402 (as shown in FIG. 13) the width "$W_N$" of the empty regions 2804 is greater of the width "$W_P$" of the empty regions 2930. The top surface of the substrate 2101 is exposed in the empty regions 2830 and the empty regions 2930.

Figure 18:
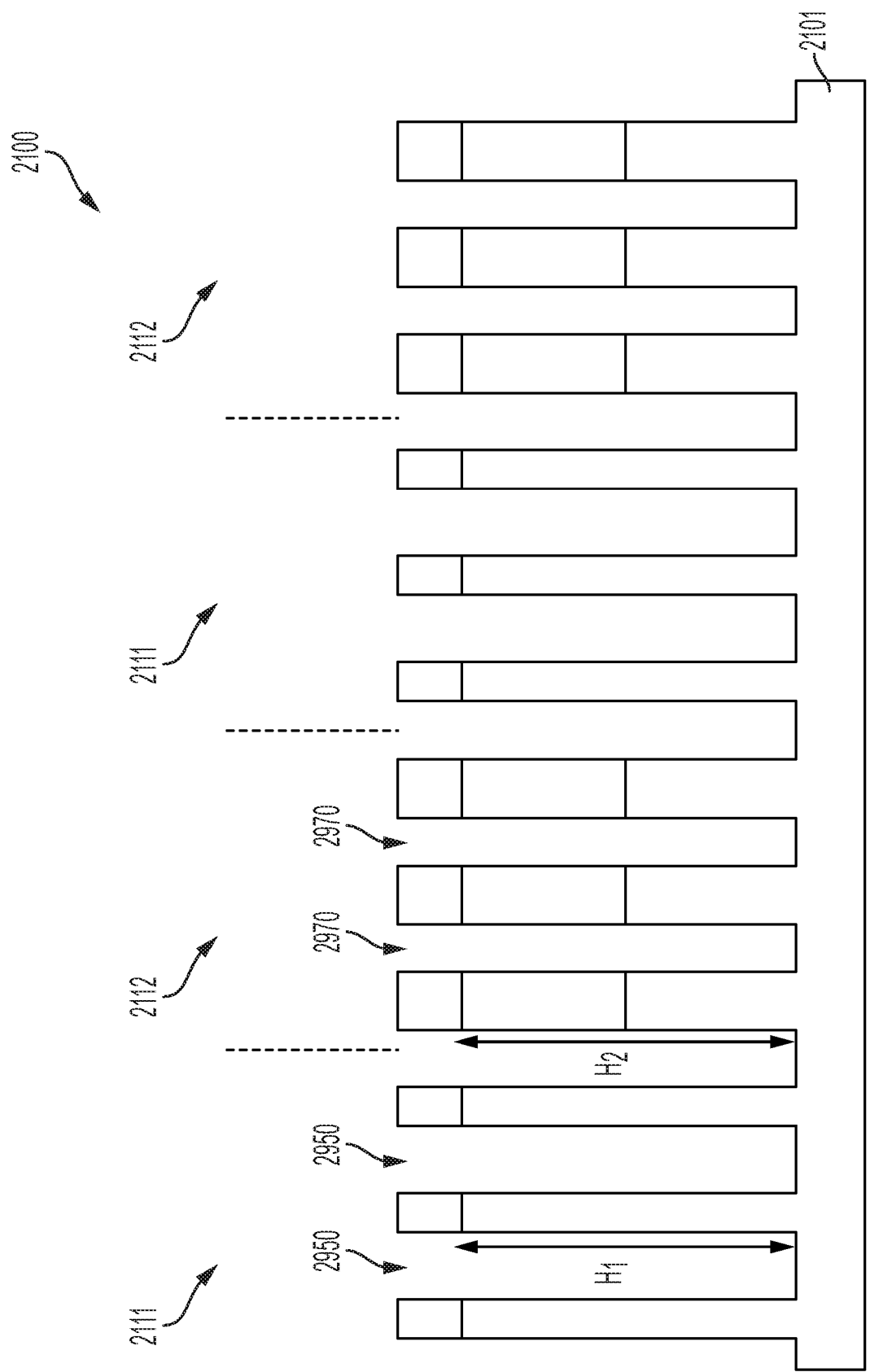

In FIG. 18, a known, semiconductor fabrication operations (e.g., RIE) are used to form a plurality of first fins 2950 and a plurality of second fins 2970 in the first substrate regions 2111 and in the second substrate regions 2112, respectively. In order to form the plurality of first fins 2950 and the plurality of second fins 2970, the substrate 2101 in the empty regions 2830 is recessed to a first height "H1" in the first substrate regions 2111 and in the empty regions 2930 to a second height "H2" in the second regions 2112. The first height "H1" and the second height "H2" can be equal.

After fabrication operations illustrated in FIG. 18, each first fin 2950 has a first Si layer 2920, while each second fin 2970 has the SiGe layers 2610 above a second Si layer 2910. In embodiments of the present invention, the n-finFET having the plurality of the first fins 2950 is formed in the first substrate regions 2111, and the p-finFET having the plurality of the second fins 2970 is formed in the second substrate regions 2112. Accordingly, as a result of the fabrication operations described in FIGS. 12-18, each second fin 2970 (having the SiGe layer 2610) is slightly wider to compensate for the fin loss during fabrication process of a final device (not shown) than each first fin 2950 (having the first Si layer 2920). As a result, in the final device (not shown) first fins 2950 and second fins 2970 have substantially the same width.

Figure 19:
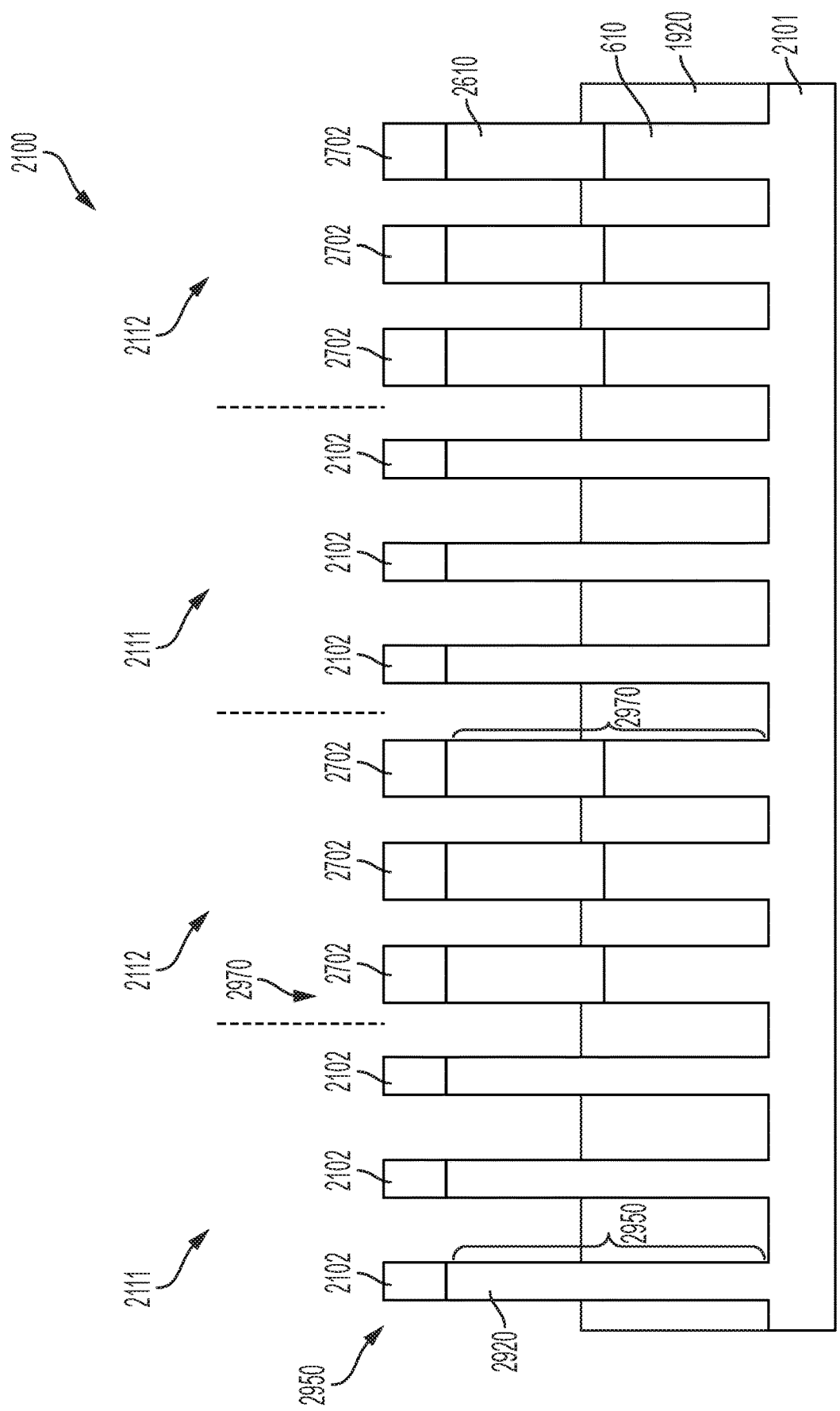

In FIG. 19, known semiconductor operations have been used to deposit a dielectric material 1920 on and between the fins 2950, 2970 and fin hard masks 2102, 2702. After depositing the dielectric material 1920, the surface can be polished to expose the fin hard mask 2102, 2702 on top of the fins 2950, 2970. Non-limiting examples of suitable dielectric materials 1920 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof. Known semiconductor operations can be used to recess the dielectric material 1920 and remove the fin hard masks 2102, 2702 (as shown in FIG. 20).

Figure 20:
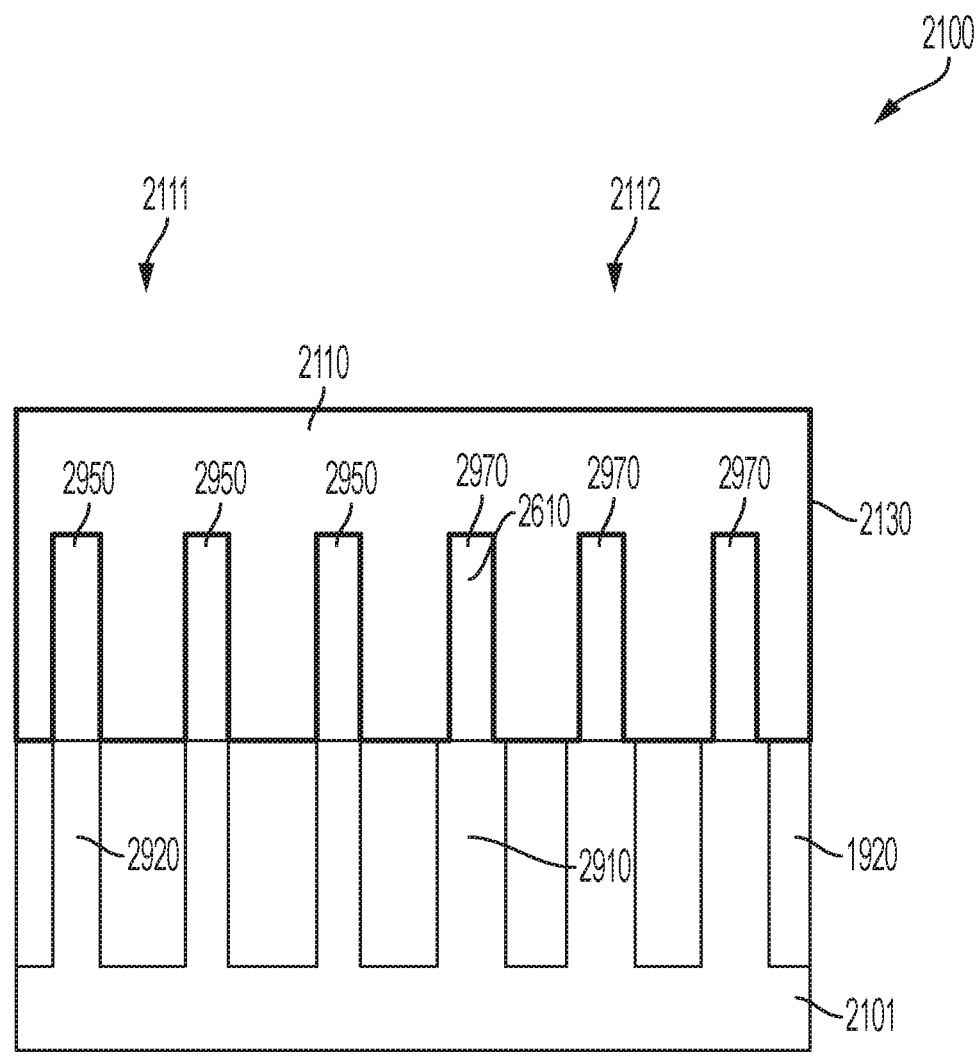

FIG. 20 is a cross-sectional side view after forming a gate 2110 on the first fins 2950 of the first substrate regions 2111 and the second fins 2970 of the second substrate regions 2112. The gate 2110 can include a metal gate stack with a gate dielectric layer 2130 deposited directly on the first fins 2950 and the second fins 2970. The gate dielectric layer 2130 can be a dielectric material having a dielectric constant greater than about 3.9, about 7.0, or about 10.0. Non-limiting examples of suitable materials for the dielectric layer 2130 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric material layer 2130 can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The gate 2110 can include a work function metal deposited on the gate dielectric layer 2130, followed by a conductive gate material (not shown). The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

A conductive material is deposited over the dielectric material(s) and work function layer(s) to form the gate stacks. Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The conductive metal can be deposited by a suitable deposition process, for example, CVD, PECVD, PVD, plating, thermal or e-beam evaporation, and sputtering. While FIG. 20 shows that both transistors (for example, n-finFET and p-finFET) share the same gate, the transistors can have different gate materials. Furthermore, n-finFET and p-finFET gates can be electrically connected or disconnected, depending on the applications. In some embodiments, a single conductive material is used to achieve the workfunction and conductive functions.

After forming the gate 2110 (shown in FIG. 20) source/drain regions (not shown) can be formed utilizing an epitaxial growth process from exposed portions of each fin 2950, 2970. The source/drain regions can have any semiconductor material including, for example, Si, Ge or silicon germanium alloys. The semiconductor material that provides the source/drain regions is doped with an n-type dopant or a p-type dopant as are well known those skilled in the art. The doping can be achieved during the epitaxial growth of the semiconductor material that provides the source/drain regions or after epitaxial growth of an intrinsic semiconductor material by utilizing ion implantation or gas phase doping.

Accordingly, FIGS. 12-20 illustrate fabrication operations of the semiconductor device 2100, where the second fins 2970 having SiGe layer 2610 are wider than first fins 2970 that do not include SiGe, but have, for example, a Si layer 2920. This results in both Si fins and SiGe fins having substantially same thickness in the final device (not shown) due to the greater fin loss in the SiGe fins (i.e., the second fins 2970).

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating an integrated semiconductor device, the method comprising:
   providing a substrate comprising a first substrate region and a second substrate region;
   forming a first field-effect transistor disposed on the substrate in the first substrate region, wherein the first field-effect transistor comprises a plurality of first fins having a first semiconductor material comprising silicon (Si); and
   forming a second field-effect transistor disposed on the substrate in the second substrate region, wherein the second field-effect transistor comprises a plurality of second fins having a second semiconductor material that differs from the first semiconductor material, the second semiconductor material comprising a silicon germanium (SiGe) alloy;
   wherein a second fin base for each second fin is wider than a first fin base for each first fin.

2. The method according to claim 1, wherein the first field-effect transistor is an n-type fin field-effect transistor (n-finFET) and the second field-effect transistor is a p-type fin field-effect transistor (p-finFET).

3. The method according to claim 2, wherein the SiGe alloy comprises germanium (Ge) content of from about 10 atomic % to about 60 atomic % Ge.

4. The method according to claim 2, wherein forming the second field-effect transistor further comprises the second semiconductor material being formed by epitaxial growth on the substrate.

5. The method according to claim 1 further comprises simultaneously etching the first substrate region to form the plurality of first fins and the second substrate region to form the plurality of second fins, wherein uppermost portions of each first fin and each second fin are coplanar.

6. A method of fabricating an integrated semiconductor device, the method comprising:
 providing a substrate comprising a first substrate region and a second substrate region;
 forming a plurality of first fins extending from the substrate in the first substrate region, wherein each first fin of the plurality of first fins comprises silicone (Si); and
 forming a plurality of second fins extending from the substrate in the second substrate region, wherein each second fin of the plurality of second fins comprises a silicon germanium (SiGe) alloy and is wider than each first fin of the of the plurality of first fins.

7. The method according to claim 6, wherein the SiGe alloy comprises germanium (Ge) content of from about 10 atomic % to about 60 atomic % Ge.

8. The method according to claim 6, wherein uppermost portions of each first fin and each second fin are coplanar.

9. The method according to claim 6, wherein the first and second substrate regions are interleaved.

10. The method according to claim 6 further comprising disposing a dielectric material around and over the plurality of first fins and the plurality of second fins.

* * * * *